United States Patent

Chang et al.

Patent Number: 5,843,534
Date of Patent: Dec. 1, 1998

[54] SCREEN PRINTING OF SURFACE LAYERS

[75] Inventors: De-An Chang, Hsinchu; Jin-Yuh Lu, Taipei, both of Taiwan

[73] Assignee: Industrial Technology Research Institute, Hsin-Chu, Taiwan

[21] Appl. No.: 789,216

[22] Filed: Jan. 24, 1997

[51] Int. Cl.$^6$ .................................................. B05D 1/32
[52] U.S. Cl. .................. 427/282; 427/331; 427/430.1
[58] Field of Search .......................... 427/282, 430.1, 427/331

[56] References Cited

U.S. PATENT DOCUMENTS

| | | | |
|---|---|---|---|
| 5,132,045 | 7/1992 | Osaka et al. | 252/301.36 |
| 5,277,840 | 1/1994 | Osaka et al. | 252/301.36 |
| 5,338,350 | 8/1994 | Tanaka et al. | 106/19 |
| 5,478,481 | 12/1995 | Kazama et al. | 210/748 |

*Primary Examiner*—Bernard Pianalto
*Attorney, Agent, or Firm*—George O. Saile; Stephen B. Ackerman

[57] ABSTRACT

A formulation of solid powder, a solvent system, a binder material, and a plasticizing agent is described whose accomplishment is achieved by means of a step-by-step process. The pastes so formulated can be employed in a screen printing process to produce surface layer patterns with various specific physical properties such as phosphorescence, electrical conductivity, mechanical adhesion, and dielectric properties as desired.

6 Claims, 1 Drawing Sheet

SCREEN PRINTING OF SURFACE LAYERS

BACKGROUND OF THE INVENTION

(1) Field of the Invention

This invention relates to a method of screen printing of surface layers on substrates from a paste formulated from an appropriate solid-binder-solvent-plasticizer combination. The printed pattern is converted by heat treatment to form thin surface layers useful as phosphors in light-emitting applications such as cathode ray screens. In particular, the paste formulation may be varied to produce printed patterns which are useful as conductor and interconnection means for printed circuits, as resistors, capacitors. inductors, or crossovers, and as sealing band patterns.

(2) Description of the Prior Art

The production of patterns of material on surfaces by means of forcing a semi-solid material held on a fine screen through a patterned opening closely adjacent to the surface is known as serigraphy or, more commonly, as silk screen printing. It has been used for many years as an economical means for producing patterns of materials commonly referred to as inks, pastes, creams, etc. which are then converted by drying, heat, or other means to a permanent pattern layer with the desired properties. In more recent times, silk as the fine screen material has been replaced by mesh screens woven from fine metal wires, and the process is referred to as simply screen printing. In the electrical and electronic industries, screen printing has been used to form conductive, resistive, insulating, and magnetic patterns, as well as combinations thereof. In general, the art of screen printing is highly dependent on the details of formulation of the ink etc. medium to be printed, hereinafter referred to as the paste as a generic term, and on the specific techniques of application of the paste to form the pattern. The success of the art of screen printing is also very dependent on the specific techniques employed, such as the size and texture of the screen or mesh, the thickness of the layer, the pressure and speed of the means of spreading and forcing the paste through the screen and the stencil openings which define the pattern, and a variety of other lesser features of the screening process.

The formulation of a screening paste requires that a uniform blending be made of the material which gives the paste its primary characteristic, such as a phosphorescent substance or phosphor, for example, which is generally a fine solid uniform powder, and the materials which provide the necessary properties of holding the powder together as a mass capable of being manipulated. The latter are generally liquids of an organic nature, and are from the classes of substances referred to as solvents, thinners, plasticizers, binders, leveling agents, etc. many of which are common to the paint and coatings art. The usual distinctions made among paints, inks, greases, pastes and the like deal with variations in their rheological properties; that is, their ability to flow. Such materials vary greatly in viscosity as well as functionality, and the term "paste" is generally reserved for compositions which possess not only a very high value of viscosity, i. e. are very thick, but also are non-Newtonian in their behaviour, the measured viscosity is a function of the rate of shear of the material being measured. Often, these materials are described as thixotropic: they undergo little or no flow or relaxation of shape while undisturbed, but flow like a liquid when mechanical stirring is employed. This property of flowing when a shearing stress is employed is very useful in pastes for screen printing, since it allows the paste to rest upon the fine mesh of the screen without leaking or oozing through until the printing tool, called the squeegee, pushes the paste along the screen and forces it through the screen to the stencil, where the paste is deposited on the adjacent surface in the pattern of the stencil. After the paste has been forced through the fine screen, its mechanical integrity and uniformity in the pattern layer are regenerated, and the pattern is retained as the layer is dried and treated, generally by heating, to remove the organic liquids and other residues and bring about the desired properties of the printed layer.

The formulations of pastes and inks useful in the screen printing of surface layers of phosphors are abundant in the literature. U.S. Pat. No. 5,478,481 to Kazama et al shows an ink composition consisting of alkylamines and phosphate salts, a binder resin that is excellent in light-emitting characteristics. U.S. Pat. Nos. 5,132,045 and 5,277,840, both to Oska et al, disclose paste compositions of phosphor powders and acrylic polymer for screen printing applications. None of the cited patents reveal the detailed use of the specific materials butyl carbitol, polyvinylbutyral (PVB), or phthalate esters such as butyl benzyl phthalate (BBP) to formulate the pastes. U.S. Pat. No. 5,338,350 to Tanaka et al discloses the use of butyl carbitol to formulate ink for a metal oxide layer, but does not mention phosphor or other powders nor the use of PVB, BBP, or other organic materials.

SUMMARY OF THE INVENTION

It is an object of the invention to provide a formulation of pastes suitable for screen printing of surface layer patterns possessing the required physical properties for the particular application. It is a further object to describe the process of accomplishing the formulation of the pastes. Still another object of the invention is to provide a method of screen printing with the aforementioned pastes to produce the desired surface pattern layers. In accordance with the objects of the invention, a formulation of solid powder, a solvent system, a binder material, and a plasticizer is described whose accomplishment is achieved by means of a step-by-step process. The pastes so formulated can be employed in a screen printing process described to produce surface layer patterns with various physical properties such as phosphorescence, electrical conductivity, mechanical adhesion and dielectric properties as desired.

DESCRIPTION OF THE PREFERRED EMBODIMENT

Figure 1:
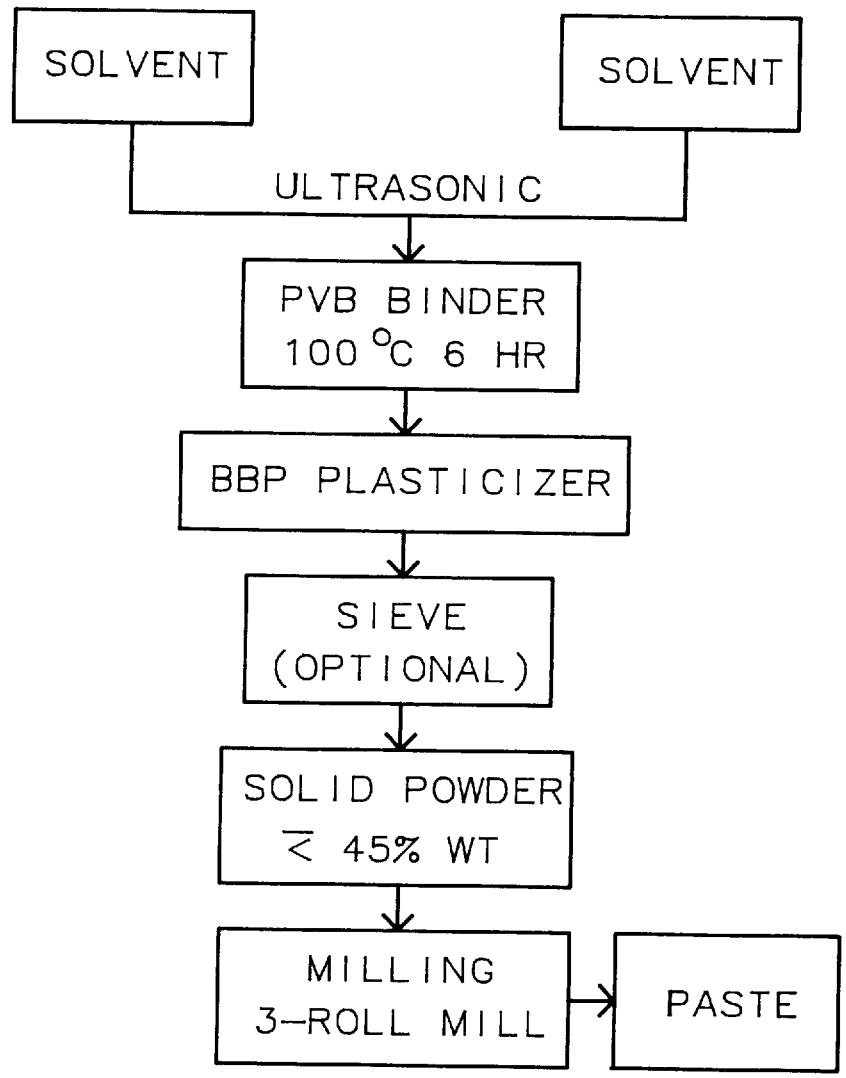
FIG. 1 is a process flow chart of the invention.

The formulation of the pastes for screen printing of surface layer patterns consists of the specific material whose properties are to provide the characteristic attributes of the pattern, blended into a mixture with a solvent system, a binder material, and a plasticizing agent. The specific material, which is analogous to the pigment or dye in an ink or paint, for example, is generally a finely-divided solid powder, whereas the other materials are generally organic liquids or polymers. An example of the paste formulation suitable for producing a surface layer pattern of a light-emitting phosphorescent material or phosphor is given in Example I. It is desirable that the materials be insoluble in aqueous

EXAMPLE I

| Solid powder: (phosphor) | | | 40% wt |
|---|---|---|---|
| Liquid | Solvent: Butyl carbitol (75%); | 70% weight | 60% wt |
| | Terpineol (25%) | | |
| | Binder: polyvinylbutyral | 20% weight | |
| | Plasticizer: Butyl benzylphthalate | 10% weight | |
| Total: | | 100% | 100% wt | media and that the organic components be capable of reacting with oxygen so that residues remaining can be removing by burning out in oxygen at elevated temperatures; for example 500 C. or above. The boiling points of the solvents should be equal to or greater than that of the binder or plasticizer, so as to assist in removal of as much as possible by evaporation.

The solid powder or powders may be selected from various materials depending on the specific application. For example, phosphors may be chosen from the compounds of the Group VI elements of the periodic chart (the chalcogenide elements oxygen, sulfur, selenium, and tellurium) with the metallic elements from Groups IIA and IIB, to which certain activators such as copper, silver, manganese, thallium, and the rare earth elements are added. Many formulations of phosphor powders are available commercially, and are often designated by proprietary trademarks and labeling systems.

The viscosity of the paste is controlled by the proportions of the formulation. If, for example, a more viscous paste is desired to produce a thicker layer in a given given screening method, the proportions can be changed as given in Example II to.

EXAMPLE II

| Solid powder: (phosphor) | | | 45% wt |
|---|---|---|---|
| Liquid: | Solvent system: Butyl carbitol (75% wt) Terpineol (25% wt) | 60% | |
| | Binder: polyvinyl butyral | 30% | 55% wt |
| | Plasticizer: butyl benzyl phthalate | 10% | |
| Total: | | 100% | 100% wt | paste with a higher solids content and a lower solvent content, resulting in a higher viscosity. The composition ranges over which pastes suitable for screen printing are produced are found to be (in weight %): solvent 40–70%; binder 10–30%; plasticizer 0–50%. These ranges apply over a range of solid powder from 0 to 45% by weight. By selecting formulations from the higher ranges of solvent content and the lower ranges of solids, binder, and plasticizer, it is possible to obtain pastes ranging in viscosity from 100,000 to 280,000 centipoise. This parameter can thus be selectively controlled along with those of the screening process to produce layers of the desired thickness and pattern acuity as well as other physical properties.

Referring now more particularly to FIG. 1, there is shown a process flow chart of the detailed procedure for carrying out the formulation specified for the pastes of the invention. In the first step, the two components of the solvent system are mixed by ultrasonic agitation. Then the binder is added to the solvent at 100 C. and held for 6 hours until the mixture is clear and free from turbidity. The plasticizer is added, and the liquid at this point may be passed through a fine sieve as an optional step to remove any foreign particulates. The desired solid powder, e.g. a zinc sulfide:manganese phosphor, is added to the combined liquids and the entire mass is then thoroughly mixed in a three-roll milling system for one hour.

The screening process used to form the surface layer patterns is carried out with a fine-mesh wire screen of 250 to 400 mesh using a squeegee pressure of 15 to 40 pounds per square inch while maintaining a screen tension of 25 to 40 Newtons per centimeter with a snapback or standoff distance between screen and substrate of 100 to 300 microns. After formation of the screened pattern, the substrate is heated for three to five hours at between 450 to 550 C. to remove the volatile components of the paste prior to firing the assembly to develop the desired final properties.

While the invention has been particularly shown and described with reference to the preferred embodiments thereof, it will be understood by those skilled in the art that various changes in form and details may be made without departing from the spirit and scope of the invention.

What is claimed is:

1. A method for forming surface layer patterns exhibiting specific physical properties comprising:

formulating a paste comprising the steps of:
blending of two solvent components by ultrasonic agitation; adding binder material to the solvent by heating to between about 80° and 120° C. for between about 45 to 75 minutes;
adding a plasticing agent to the paste;
passing the paste through a sieve to remove particulates;
adding a solid powder; and
milling the paste in a three-roll milling system;

applying the paste to a fine-mesh screen in contact with a pattern stencil adjacent to a surface to be patterned;

forming a layer pattern of paste material on the surface by forcing the paste through the stencil openings and screen mesh onto the surface by means of a squeegee; and post-screening conversion of the paste pattern to the corresponding pattern of desired material by appropriate treatment.

2. The method of claim 1 wherein said screen size is between about 250 to 400 mesh.

3. The method of claim 1 wherein said squeegee pressure to force the paste to the surface is between about 15 and 40 pounds per square inch.

4. The method of claim 1 wherein said screen is maintained at a tension of between about 25 to 40 Newtons per centimeter.

5. The method of claim 1 wherein said screen is kept between about 100 and 300 microns away from the surface on which the paste pattern is to be formed.

6. The method of claim 1 wherein the post-screening treatment of the surface layer pattern consists of heating for between about 3 to 5 hours at between about 450 to 550 C. for complete removal of volatile binder residues.

* * * * *